(12) United States Patent
Furukawa et al.

(10) Patent No.: US 8,164,102 B2
(45) Date of Patent: Apr. 24, 2012

(54) SEMICONDUCTOR LIGHT EMITTING DEVICE

(75) Inventors: Chisato Furukawa, Fukuoka-ken (JP);
Takafumi Nakamura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 11/392,764

(22) Filed: Mar. 30, 2006

(65) Prior Publication Data

US 2006/0220053 A1 Oct. 5, 2006

(30) Foreign Application Priority Data

Mar. 30, 2005 (JP) .................................. 2005-099116
Feb. 2, 2006 (JP) .................................. 2006-025785

(51) Int. Cl.
*H01L 29/18* (2006.01)

(52) U.S. Cl. ............ 257/88; 257/89; 257/98; 257/99; 257/100; 257/E33.058; 257/E33.059; 257/E33.06

(58) Field of Classification Search .................. None
See application file for complete search history.

(56) References Cited

U.S. PATENT DOCUMENTS

| | | | |
|---|---|---|---|
| 5,962,971 | A | 10/1999 | Chen |
| 6,590,233 | B2 | 7/2003 | Sugawara |
| 2002/0190262 | A1* | 12/2002 | Nitta et al. ....................... 257/99 |
| 2003/0080341 | A1* | 5/2003 | Sakano et al. .................. 257/79 |

FOREIGN PATENT DOCUMENTS

| | | |
|---|---|---|
| JP | 06-326364 | 11/1994 |
| JP | 11-145519 | 5/1999 |
| JP | 2000-294834 | 10/2000 |
| JP | 2000-349345 | 12/2000 |
| JP | 2001-068734 | 3/2001 |
| JP | 2002-050797 | 2/2002 |
| JP | 2002-057376 | 2/2002 |
| JP | 2002-252374 | 9/2002 |
| JP | 2004-238589 | 8/2004 |

OTHER PUBLICATIONS

Rejection Notice for corresponding Japanese Patent Application No. 2006-025785 drafted Nov. 29, 2010.

* cited by examiner

*Primary Examiner* — Davienne Monbleau
*Assistant Examiner* — Leslie Pilar Cruz
(74) *Attorney, Agent, or Firm* — Banner & Witcoff, Ltd.

(57) ABSTRACT

A semiconductor light emitting device may include a first lead; a second lead; a first semiconductor light emitting element mounted on the first lead, being configured to emit a light having an optical emission spectrum no more than 400 nm from a light extraction surface of the first semiconductor light emitting element; a second semiconductor light emitting element mounted on the second lead, being configured to emit a light having a peak wavelength in no less than 550 nm; an ultraviolet absorbing layer configured to cover the light extraction surface of the first semiconductor light emitting element; and a sealing resin configured to cover the ultraviolet absorbing layer, first semiconductor light emitting element and the second semiconductor light emitting element.

28 Claims, 9 Drawing Sheets

SEMICONDUCTOR LIGHT EMITTING DEVICE

CROSS REFERENCE TO RELATED APPLICATION

This application is based upon and claims the benefit of priority from Japanese Patent Application No. P2005-99116, filed on Mar. 30, 2005, and from Japanese Patent Application No. P2006-25785, filed on Feb. 2, 2006, the entire contents of which are incorporated herein by reference.

BACKGROUND

A semiconductor light emitting device, which emits white light and is used for general lightings, is noticeable because of its characteristics, low electric consumption and long life. Generally, a white LED (emit white light) is composed of an LED chip and phosphor(s), three RGB LED chips, or a combination of different wavelength LED chips. For example, the white LED is composed of a combination of a blue LED chip and a yellow phosphor, a blue LED chip and a yellow LED chip, or an ultraviolet (UV) LED chip and three primary colors (RGB) phosphors.

A blue LED chip and an ultraviolet LED chip have optical spectrum in ultraviolet band. A sealing resin, which seals and covers those chips, may be worsened by irradiated ultraviolet light. So a resin, which absorbs ultraviolet light, used for sealing blue or shorter wavelength LED chip is disclosed in Japanese Patent Application Laid Open No. 2004-238589.

In case a white LED is obtained by a combination of a different wavelength LED chips, a GaN based LED chip, which is capable of emitting blue or shorter wavelength, and a AlInGaP based LED chip, which is capable of emitting longer wavelength are provided in a package of SMD (Surface Mount device), and those LED chips are sealed by an ultraviolet absorbing resin. The ultraviolet absorbing resin is relatively hard. The GaN based LED chip, which has relatively high hardness, may be not damaged by a stress from the ultraviolet absorbing resin. However, the AlInGaP based LED chip may be damaged by a stress from the ultraviolet absorbing resin, since the AlInGaP based LED chip has lower hardness.

SUMMARY

Aspects of the invention relate to an improved semiconductor light emitting device.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIGS. 2A-5A are plan views of a part of the manufacturing process of the semiconductor light emitting device of the first embodiment. FIG. 2B-5B, 6 are cross-sectional views of a part of the manufacturing process of the semiconductor light emitting device of the first embodiment.

FIG. 10 is a plan view of a part of the manufacturing process of the semiconductor light emitting device of the third embodiment.

DETAILED DESCRIPTION

Various connections between elements are hereinafter described. It is noted that these connections are illustrated in general and, unless specified otherwise, may be direct or indirect and that this specification is not intended to be limiting in this respect.

For purposes herein, visible light is generally defined as 400 to 700 nm or 380 to 780 nm.

Embodiments of the present invention will be explained with reference to the drawings as follows.

General Overview

In one aspect of the present invention, a semiconductor light emitting device may include a first lead; a second lead; a first semiconductor light emitting element mounted on the first lead, being configured to emit a light having an optical emission spectrum no more than 400 nm from a light extraction surface of the first semiconductor light emitting element; a second semiconductor light emitting element mounted on the second lead, being configured to emit a light having a peak wavelength in no less than 550 nm; an ultraviolet absorbing layer configured to cover the light extraction surface of the first semiconductor light emitting element; and a sealing resin configured to cover the ultraviolet absorbing layer, first semiconductor light emitting element and the second semiconductor light emitting element.

In another aspect of the invention, a semiconductor light emitting device may include a first lead; a second lead; a first semiconductor light emitting element mounted on the first lead, being configured to emit a light having an optical emission spectrum no more than 400 nm from a light extraction surface of the first semiconductor light emitting element; a second semiconductor light emitting element mounted on the second lead, being configured to emit a light having a peak wavelength in no less than 550 nm from a light extraction surface of the second semiconductor light emitting element; an ultraviolet absorbing layer configured to cover the light extraction surface of the first semiconductor light emitting element and the light extraction surface of the second semiconductor light emitting element; and a sealing resin configured to cover the ultraviolet absorbing layer, first semiconductor light emitting element and the second semiconductor light emitting element.

First Embodiment

A first embodiment of the present invention will be explained hereinafter with reference to FIGS. 1A-4C, FIGS. 8-11.

Figure 1A:
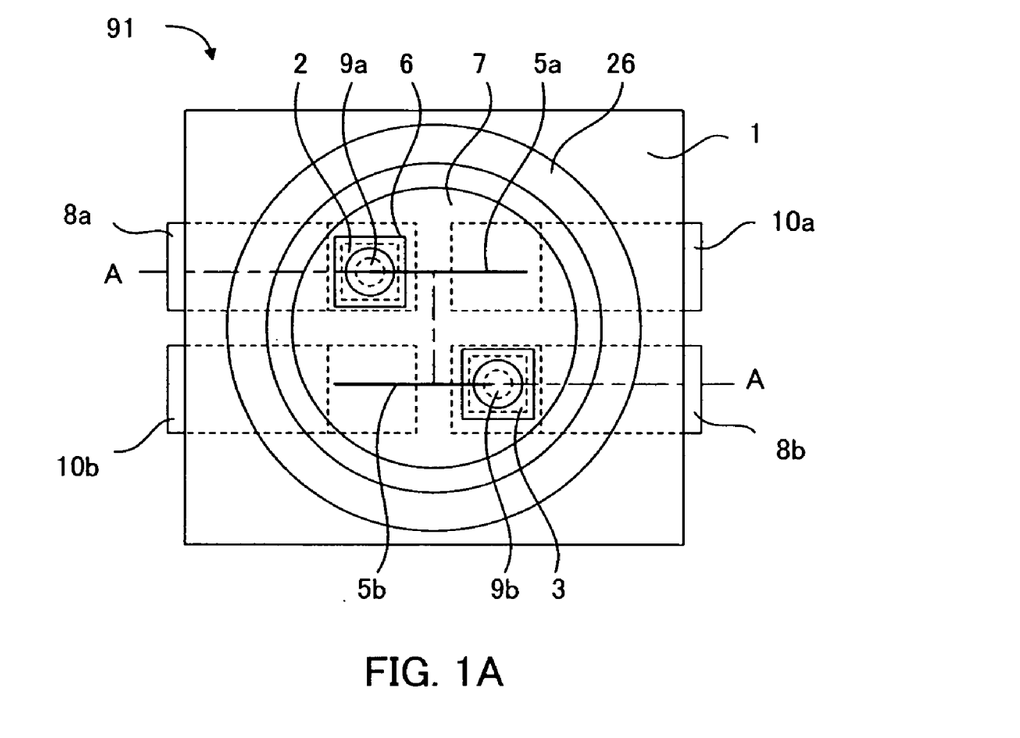
FIG. 1A is a plan view of a semiconductor light emitting device in accordance with a first embodiment of the present invention.
Figure 1B:
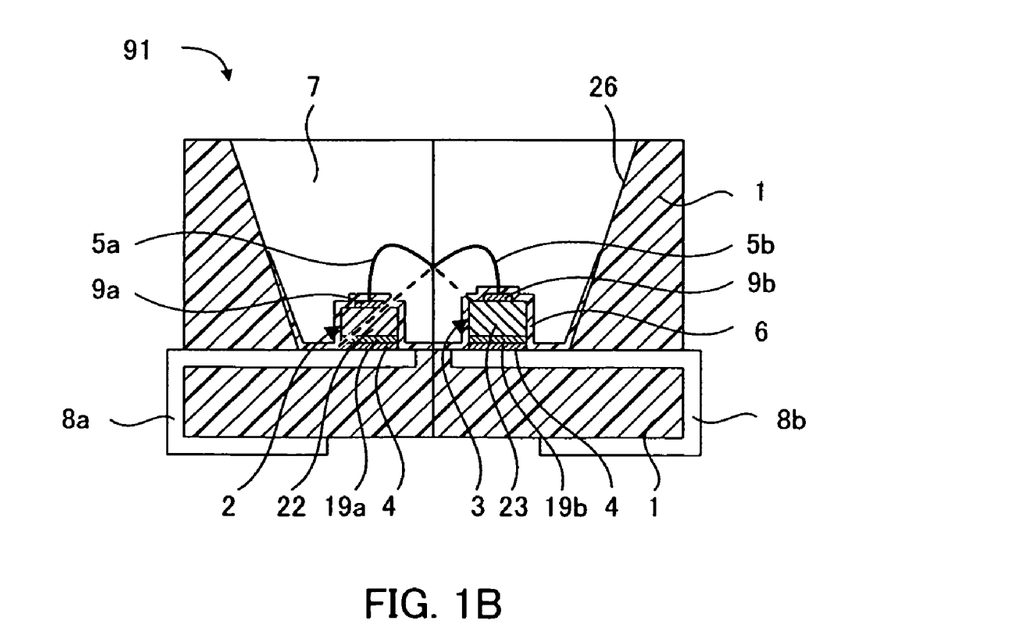
FIG. 1B is a cross-sectional view of a semiconductor light emitting device taken along A-A line in FIG. 1A.

FIG. 1A is a plan view of a semiconductor light emitting device 91 in accordance with a first embodiment of the present invention. FIG. 1B is a cross-sectional view of the semiconductor light emitting device 90 taken along A-A line in FIG. 1A. FIGS. 2A-5A are plan views of a part of the manufacturing process of the semiconductor light emitting device 91. FIG. 2B-5B, 6 are cross-sectional views of a part of the manufacturing process of the semiconductor light emitting device 91. FIG. 7 is a CIE color diagram regarding to the semiconductor light emitting device 91.

A structure of the semiconductor light emitting device 91 will be explained hereinafter with reference to FIGS. 1A, 1B.

As shown in FIGS. 1A, 1B, in the semiconductor light emitting device 91, a lead 8a, 8b, 10a, 10b is provided in a package 1, which has a cup shaped portion 26. A part of the leads 8a, 8b, 10a, 10b is exposed from the package 1 at a bottom of the cup shaped portion 26. The cup shaped portion 26 expands to upward. A GaN based blue LED chip 2, which may be formed on a substrate 22, may be mounted on a lead 8a via a conductive adhesive 4 in the cup shaped portion 26. An AlInGaP based yellow LED chip 3, which may be formed on a substrate 23, may be mounted on a lead 8b via the conductive adhesive 4 in the cup shaped portion 26. An electrode 9a, which may be provided on an upper surface of the blue LED chip 2 may be electrically connected to the lead 10a via an Au wire 10a. An electrode 9b, which may be provided on an upper surface of the yellow LED chip 3 may be electrically connected to the lead 10b via an Au wire 10b. An ultraviolet absorbing layer 6 may be provided on a surface of the blue LED chip 2 and the yellow LED chip 3. A sealing resin 7 may be provided in the cup shaped portion 26 of the package 1, so as to seal the blue LED chip 2, the yellow LED chip 3, and the ultraviolet absorbing layer 6. A hardness of the sealing resin 7 may be less than a hardness of the ultraviolet absorbing layer 6.

As shown in FIG. 1A, the leads 8a, 8b, 10a, 10b are spaced each other. The lead 10a extends in a direction opposite to a direction which the lead 8a extends to. The lead 10b extends in a direction opposite to a direction which the lead 8b extends to. The leads 8a, 10b extend in a same direction. The leads 8b, 10a extend in a same direction. The leads 8a, 8b, 10a, 10b may be made of a lead frame material having a Cu as a main component, or made of Fe based lead frame material. The package 1 may be mold resin, such as an epoxy resin or a thermoplastic resin.

An exposed part of leads 8a, 8b, 10a, 10b, which may be provided on a bottom surface of the package 1 and exposed from the package 1 to outside, functions as an external terminal, and may be electrically connected to a print board (not shown in FIGS. 1A, 1B).

The blue LED chip 2 may have an $In_xGa_{1-x}N$ active layer, from which about 440 μm peak wavelength light may be emitted. X may be, for example about 0.05. The active layer may be formed on a SiC substrate 22. The blue LED chip 2 has an upper electrode 9a on its upper side and a lower electrode 19a on its lower side.

The yellow LED chip 3 may have an $In_{0.5}(Ga_{1-x}Al_x)_{0.5}P$ active layer, from which about 590 nm peak wavelength light may be emitted. X may be, for example about 0.0026. The active layer may be formed on a conductive GaP substrate 23. The yellow LED chip 3 has an upper electrode 9b on its upper side and a lower electrode 19b on its lower side.

The blue LED chip 2 and the yellow LED chip 3 are mounted on the leads 8a, 8b in the cup shaped portion 26, respectively, such that the blue LED chip 2 and the yellow LED chip 3 are provided symmetric to a center of the cup shaped portion 26.

The ultraviolet absorbing layer 6 may be a cyanoacrylate, such as Ethyl2-cyano3 3-diphenylacrylate. The ultraviolet absorbing layer 6 may be used benzotriazol, salicylate, or benzophenone. The ultraviolet absorbing layer 6 may be mixed cyanoacrylate, benzotriazol, salicylate, or benzophenone. However, the ultraviolet absorbing layer 6 is not limited to these kinds of materials. The ultraviolet absorbing layer 6 may be other materials, which are capable of absorbing or blocking the ultraviolet light.

A manufacturing process of the semiconductor light emitting device 91 as shown in FIGS. 1A, 1B will be explained hereinafter with reference to FIGS. 2A-6.

Figure 2A:
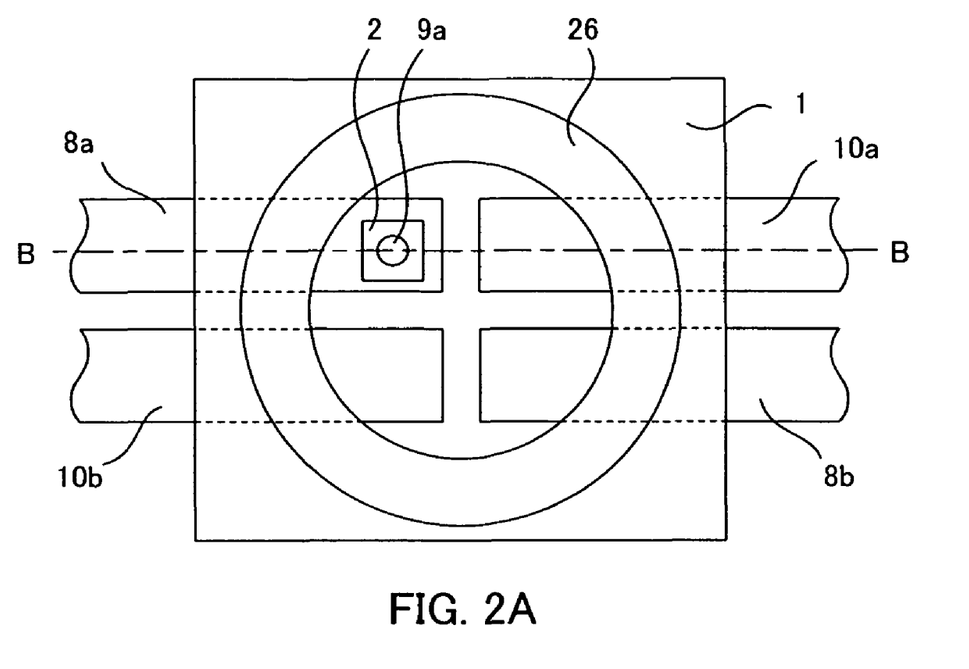
Figure 2B:
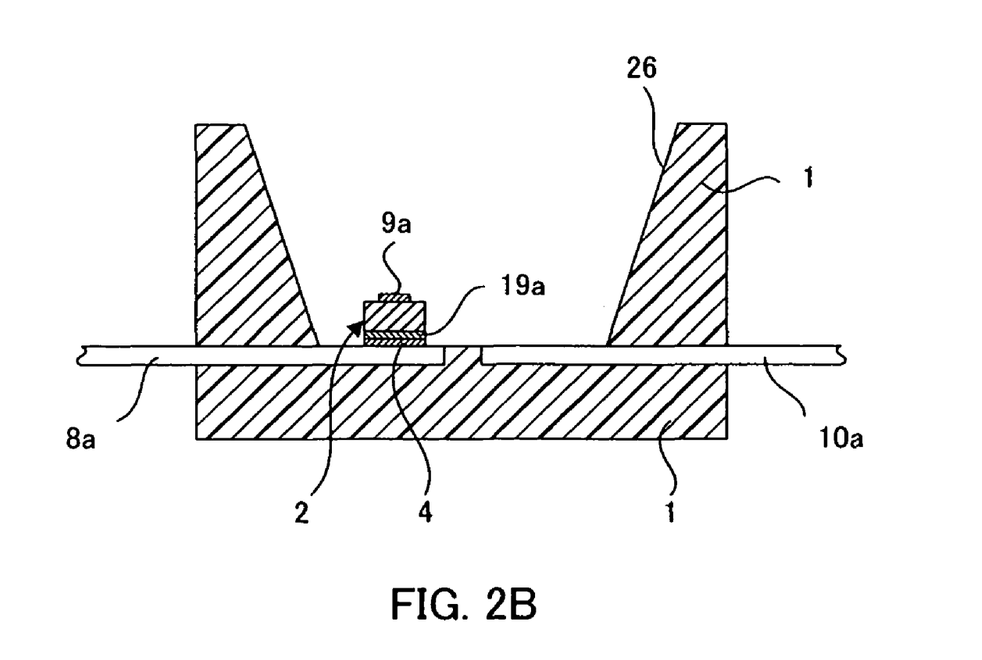

As shown in FIGS. 2A, 2B, the blue LED chip 2 may be mounted on the lead 8a in the cup shaped portion 26 of the package 1 via the conductive adhesive 4, with the upper electrode 9a facing upward.

Figure 3A:
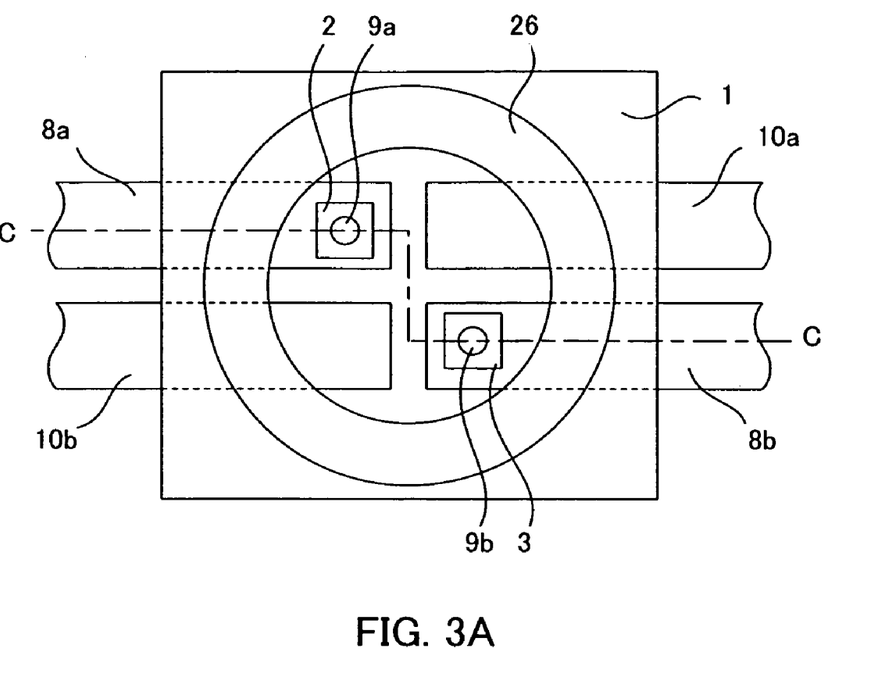
Figure 3B:
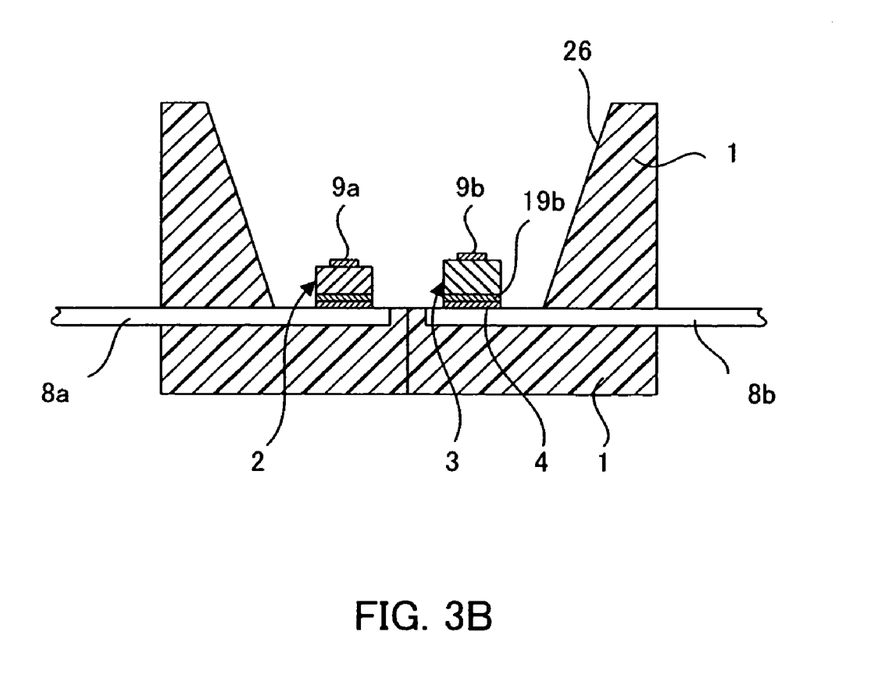

As shown in FIGS. 3A, 3B, the yellow LED chip 3 may be mounted on the lead 8b in the cup shaped portion 26 of the package 1 via the conductive adhesive 4, with the upper electrode 9b facing upward.

The blue LED chip 2 and the yellow LED chip 3 may be mounted in the same manufacturing process, or the blue LED chip 2 may be mounted to the lead 8a after the yellow LED chip 3 may be mounted on the lead 8b.

Figure 4A:
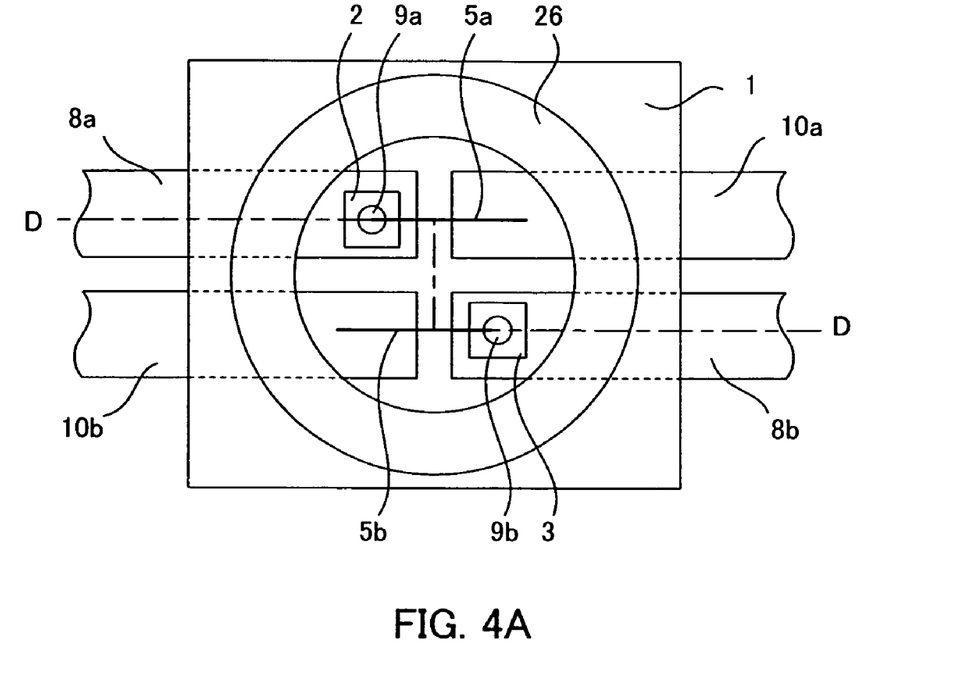
Figure 4B:
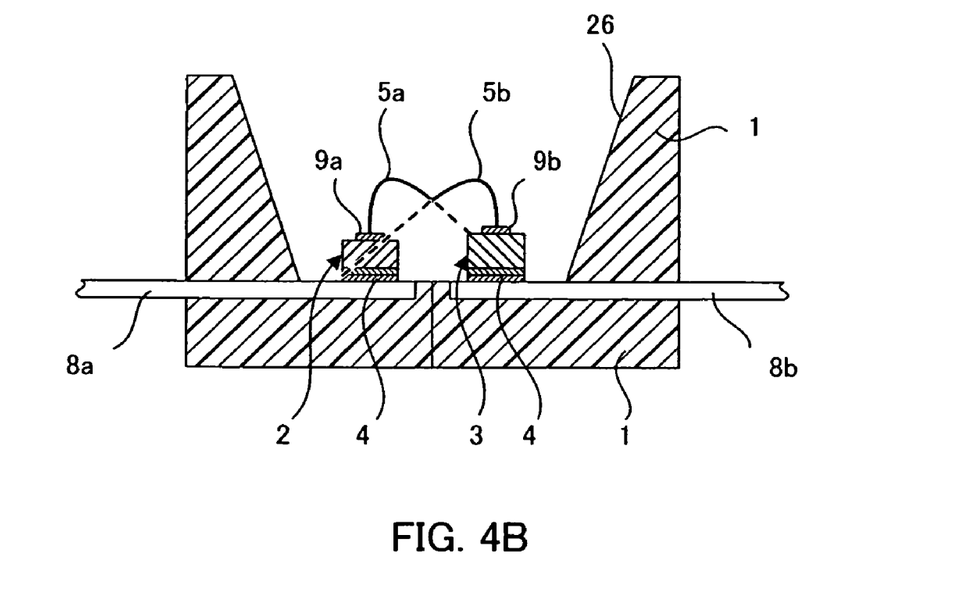

As shown in FIGS. 4A, 4B, the upper electrode 9a of the blue LED chip 2 may be electrically connected to the lead 10a via the wire 5a, and the upper electrode 9b of the yellow LED chip 3 may be electrically connected to the lead 10b.

Figure 5A:
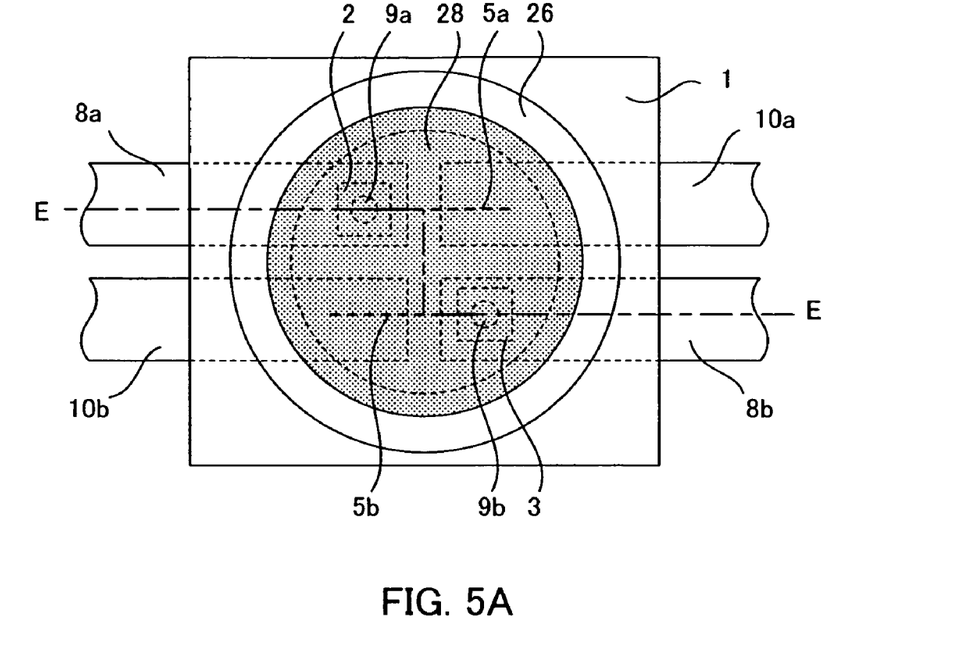
Figure 5B:
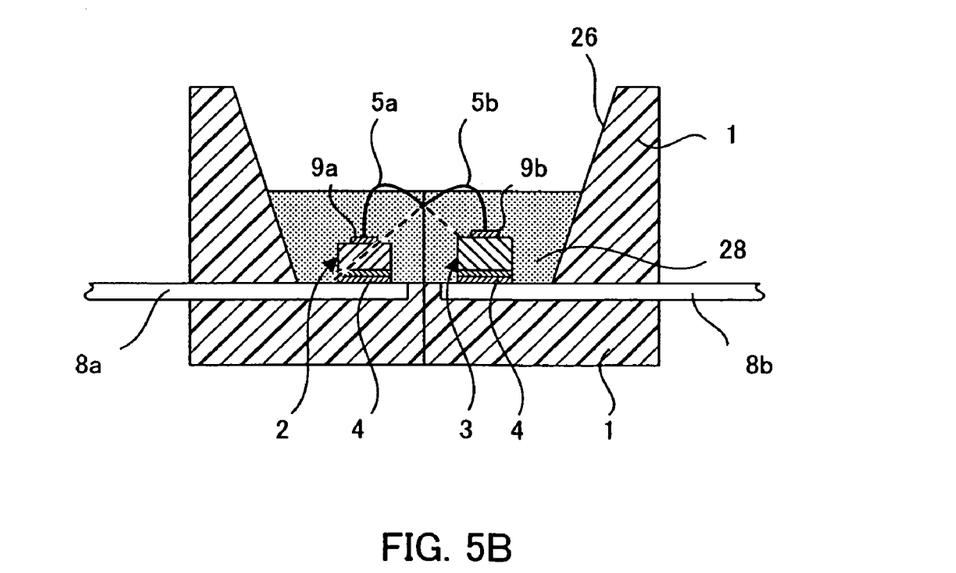

As shown in FIGS. 5A, 5B, an ultraviolet absorbing solution 28, which has the ultraviolet absorbing material 6 dissolved in a solvent, may be provided in the cup shaped portion 26, such that the blue LED chip 2 and the yellow LED chip 3 are covered with the ultraviolet absorbing solution 28. That is, the upper surface of the ultraviolet absorbing solution 28 may be over the upper surface of the blue LED chip 2 and the yellow LED chip 3. The ultraviolet absorbing solution 28 may be added into the cup shaped portion 26 by using dispenser. A heat treatment may be provided with that state, such that the solvent is vaporized.

Figure 6:
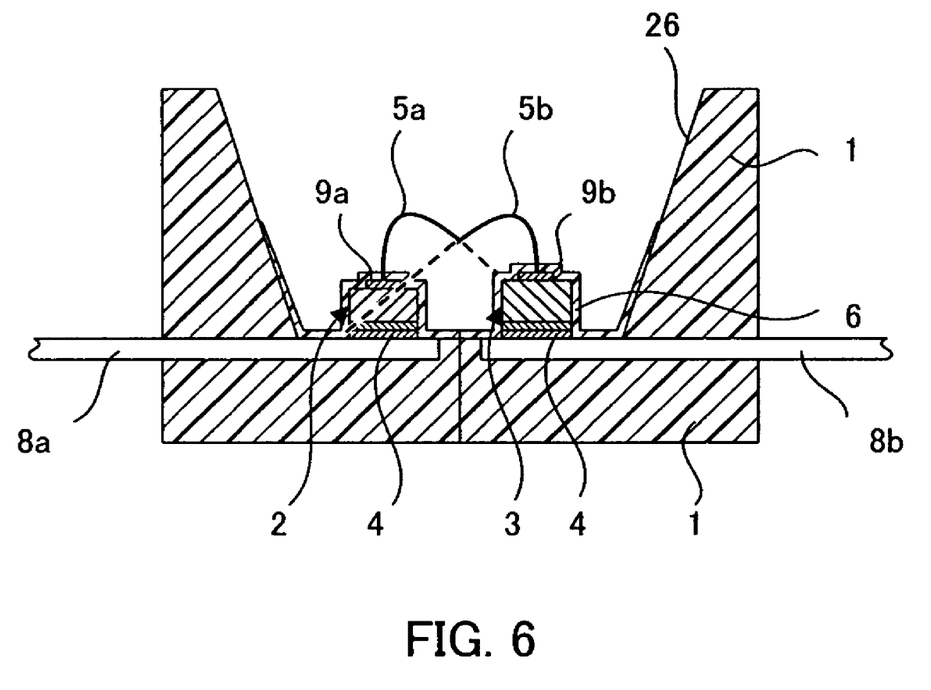
Figure 7:
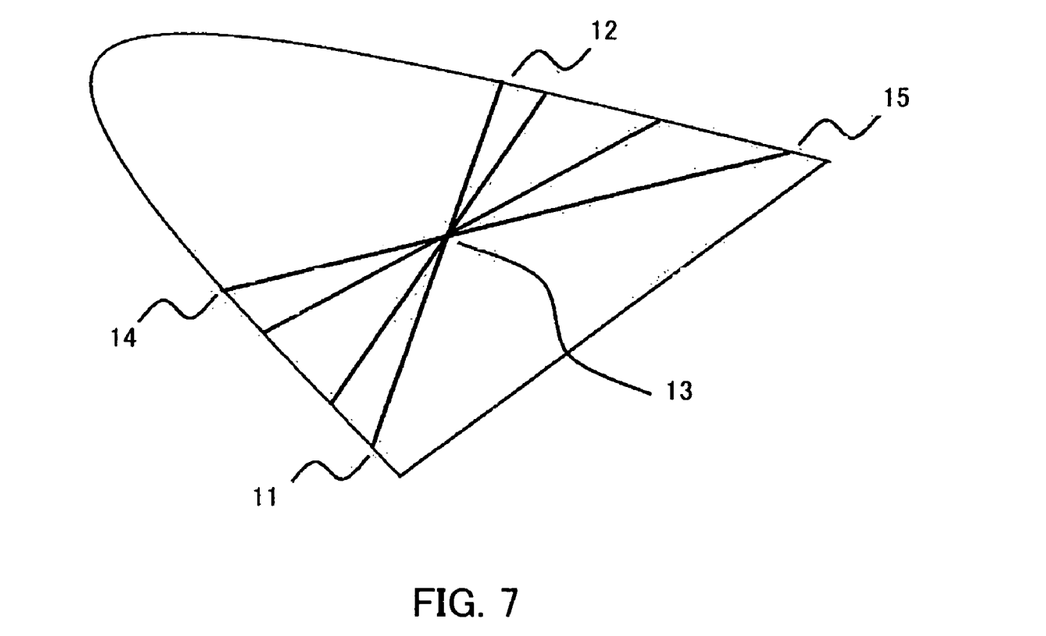
FIG. 7 is a CIE color diagram regarding to the semiconductor light emitting device of the first and a second embodiment.

As shown in FIG. 6, the ultraviolet absorbing layer 6, which is dissolved in the ultraviolet absorbing solution 28 as the ultraviolet absorbing material, is left on the LED chips 2, 3. The ultraviolet absorbing layer 6 may be provided on the upper surfaces and side surfaces of the LED chips 2, 3. That is, light extraction surfaces of the LED chips 2, 3 are covered with the ultraviolet absorbing layer 6.

The ultraviolet absorbing layer 6 may be also provided on the leads 8a, 8b, 10a, 10b in the cup shaped portion 26, and on the inner surface of the cup shaped portion 26, since the ultraviolet absorbing solution 28 is provided thereon before vaporization.

The thickness of the ultraviolet absorbing layer 6 may be about 20 μm-1 mm. The thickness of the ultraviolet absorbing layer 6 may be thicker near the bottom of the cup shaped portion 26 and thinner away from the bottom of the cup shaped portion 26. An upper edge of the ultraviolet absorbing layer 6 may be provided over the LED chips 2, 3 as shown in FIG. 1A.

The sealing resin 7 in a fluid state may be added to the cup shaped portion 26 so as to fill the cup shaped portion 26. The LED chips 2, 3 and the ultraviolet absorbing layer 6 are covered with the sealing resin 7. Later, the sealing resin 7 may be cured. The leads 8a, 8b, 10a, 10b are separated from a lead frame, and bended to the bottom surface of the package 1 as shown in FIG. 1A. So the semiconductor light emitting device 91 as shown in FIG. 1A is manufactured.

In the semiconductor light emitting device 91, the blue LED 2, which emit light having peak wavelength about 430-450 nm, has optical spectrum in ultraviolet band (400 nm or less). The optical spectrum in ultraviolet band is a high energy and is absorbed by the sealing resin 7 more than the longer wavelength band is absorbed. The ultraviolet absorbing layer 6, which may be provided on the light extraction surface of the blue LED chip 2, may be capable of absorbing ultraviolet band. So the amount of ultraviolet light reaching the sealing resin 7 may be reduced, and a degradation of the sealing resin 7 occurred near the boundary between the light extraction surface of the blue LED chip and the sealing resin 7, may be reduced. A longer term stable operation of the semiconductor light emitting device, long life, may be obtained, since the degradation of the sealing resin 7 may be reduced.

A sealing resin for sealing green or longer wavelength, which has a lower resin stress than a conventional sealing resin for blue or shorter wavelength LED chip, may be applicable to the sealing resin for the semiconductor light emitting device 91. Namely, damage to the LED chips, especially the AlInGaP LED chip which has low hardness, may be reduced.

A color fraction of white light emitted from the semiconductor light emitting device 91 may be reduced, since the blue light and the yellow light are decided by a bandgap of the semiconductors formed in the LED chips.

As shown in FIG. 7, a light representing by line from a blue light 11 through a white light 13 to a yellow light 12 may be obtained by changing the light volume emitted the blue LED chip and the yellow LED chip, respectively.

The cup shaped portion 26 shown in FIGS. 1A, 1B may be a circle shape in a plan view. However a shape of the cup shaped portion 26 in a plan view is not limited to this. The cup shaped portion 26 may be ellipse, triangle, square, rectangle or hexagonal shape in plan view.

An inner surface of the cup shaped portion 26 shown in FIGS. 1A, 1B is slanted and expanded upward. However, a shape of the cup shaped portion 26 in a plan view is not limited to this. The inner surface of the cup shaped portion 26 may be slanted and narrowed to upward, or may be substantially vertical surface.

In this embodiment, the light extraction surface (upper and side surfaces in FIGS. 1A, 1B) of the LED chips are covered with the ultraviolet absorbing layer. However, the ultraviolet absorbing layer may be not provided the entire of the light extraction surface. The ultraviolet absorbing layer may be provided only on a main light extraction surface. The main light extraction surface is a surface, which light is emitted from the most in surfaces of a chip.

The conductive adhesive 4 may be a conductive adhesive, a solder, or an Ag paste.

Second Embodiment

A second embodiment is explained with reference to FIG. 8.

A semiconductor light emitting device 92 is described in accordance with a second embodiment of the present invention. With respect to each portion of this embodiment, the same or corresponding portions of the semiconductor light emitting device of the first embodiment shown in FIGS. 1-7 are designated by the same reference numerals, and explanation of such portions is omitted.

Figure 8:
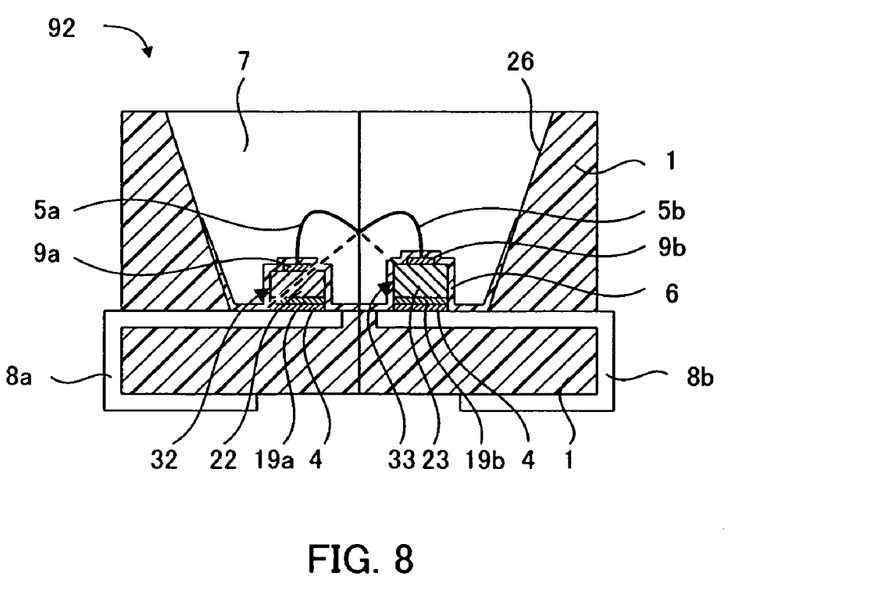
FIG. 8 is a cross-sectional view of a semiconductor light emitting device in accordance with a second embodiment of the present invention.

FIG. 8 is a cross-sectional view of a semiconductor light emitting device 92 in accordance with a second embodiment of the present invention.

In this second embodiment, LED chips used in the semiconductor light emitting device 92 are different from those in the first embodiment.

As shown in FIG. 8, the semiconductor light emitting device 92 has a cyan LED chip 32 and a red LED chip 33.

The cyan LED chip 32 may have an $In_xGa_{1-x}N$ active layer, which about 480 nm peak wavelength light is emitted from. X may be, for example about 0.3. The active layer may be formed on a SiC substrate 22. The cyan LED chip 32 has an upper electrode 9a on its upper side and a lower electrode 19a on its lower side.

The red LED chip 33 may have an $In_{0.5}(Ga_{1-x}Al_x)_{0.5}P$ active layer, which about 620 nm peak wavelength light is emitted from. X may be, for example about 0.001. The active layer may be formed on a conductive GaP substrate 23. The red LED chip 33 has an upper electrode 9b on its upper side and a lower electrode 19b on its lower side.

The semiconductor light emitting device 92 may be manufactured as explained in the first embodiment.

In this second embodiment, the ultraviolet absorbing layer 6 is provided on a light extraction surface of the cyan LED chip 32 and the red LED chip 33. Ultraviolet light may be absorbed by the ultraviolet absorbing layer 6. So the amount of ultraviolet light reaching the sealing resin 7 is reduced, and a degradation of the sealing resin 7 generated near the boundary between the light extraction surface of the cyan LED chip and the sealing resin 7, may be reduced.

As shown in FIG. 7, a light representing by line from a cyan light 14 through a white light 13 to a red light 15 may be obtained by changing the light volume emitted the cyan LED chip 32 and the red LED chip 33, respectively.

Third Embodiment

A second embodiment is explained with reference to FIGS. 9A-10.

A semiconductor light emitting device 93 is described in accordance with a third embodiment of the present invention. With respect to each portion of this embodiment, the same or corresponding portions of the semiconductor light emitting device of the first, second embodiment shown in FIGS. 1-8 are designated by the same reference numerals, and explanation of such portions is omitted.

Figure 9A:
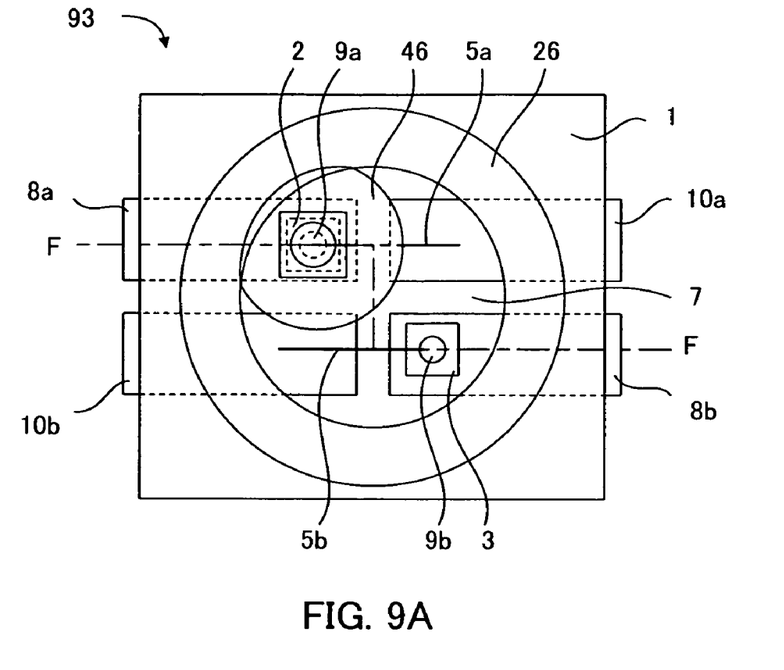
FIG. 9A is a plan view of a semiconductor light emitting device in accordance with a third embodiment of the present invention.

FIG. 9A is a plan view of a semiconductor light emitting device 93 in accordance with a third embodiment of the present invention. FIG. 9B is a cross-sectional view of the semiconductor light emitting device 93 taken along F-F line in FIG. 9A.

With comparing to the semiconductor light emitting device 91 of the first embodiment, the yellow LED chip 3 and its periphery are not covered with an ultraviolet absorbing layer 46 in the semiconductor light emitting device 93.

Figure 9B:
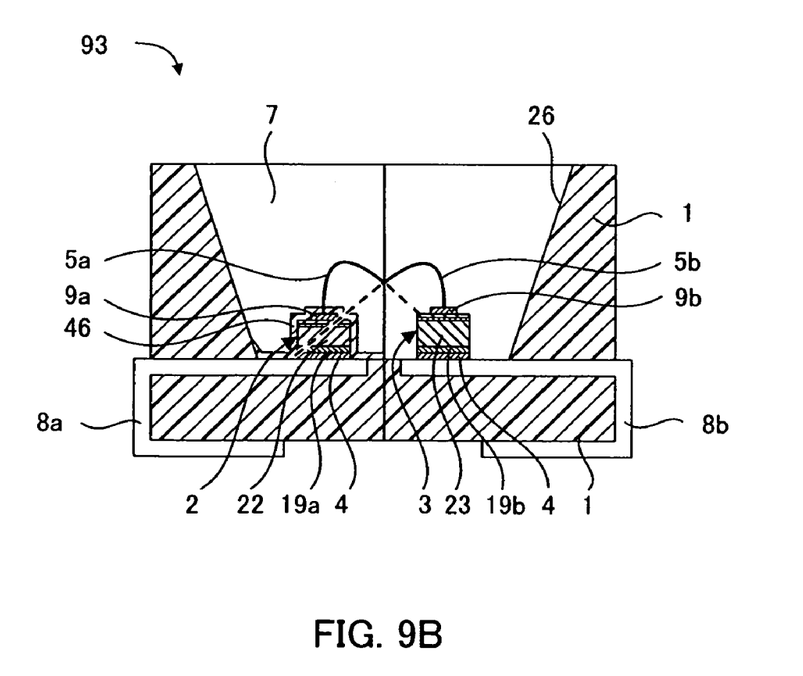
FIG. 9B is a cross-sectional view of a semiconductor light emitting device taken along F-F line in FIG. 9A.

As shown in FIGS. 9A, 9B, the ultraviolet absorbing layer 46 is provided on the blue LED chip 2, the lead 8a in the cup shaped portion 26 and an inner surface of the cup shaped portion 26 near the blue LED chip 2. The thickness of the ultraviolet absorbing layer 26 may be about 20 μm-about 100 μm. The ultraviolet absorbing layer 46 is a same material as explained ultraviolet absorbing layer 6 or cup shaped portion 26.

A manufacturing process of the semiconductor light emitting device 93 as shown in FIG. 9 will be explained hereinafter with reference to FIGS. 10A-10B.

The manufacturing process of the semiconductor light emitting device 93 is different in an ultraviolet absorbing solution 48 adding process from that of the semiconductor light emitting device 91 explained in the first embodiment.

Figure 10A:
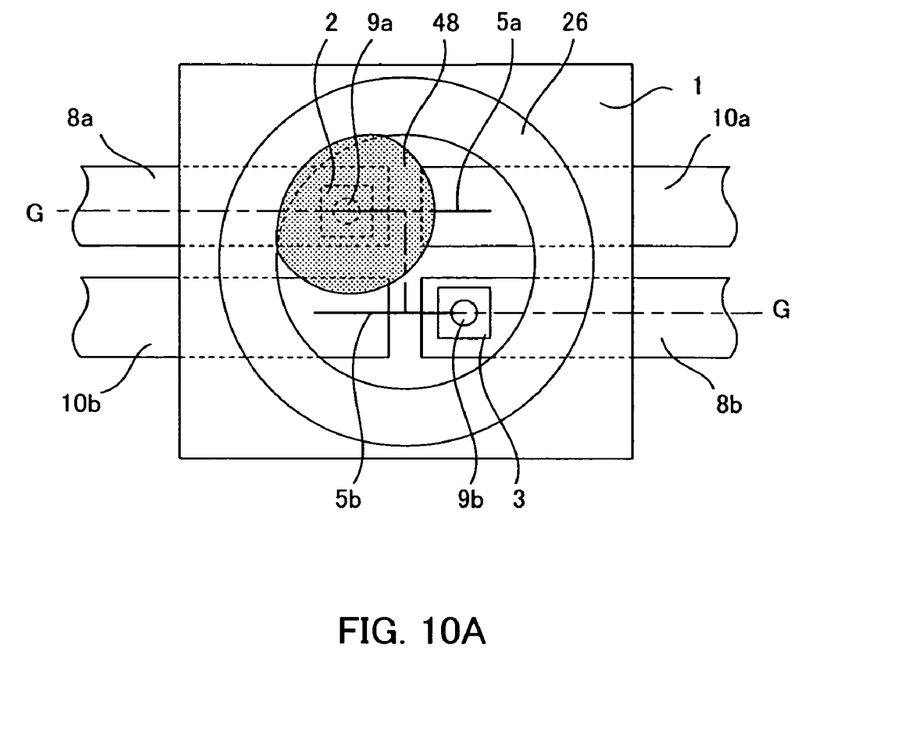
Figure 10B:
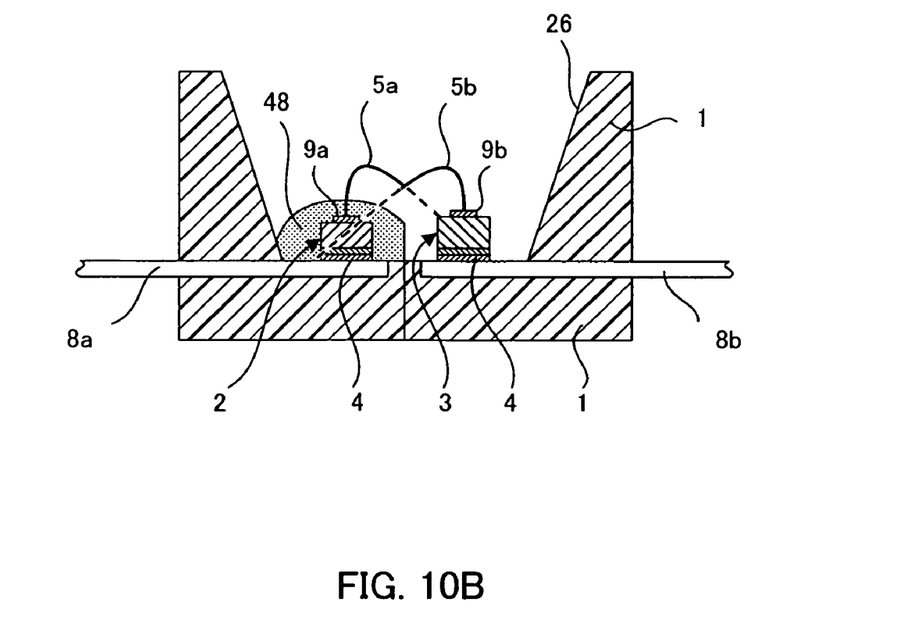
FIG. 10B is a cross-sectional view of a part of the manufacturing process of the semiconductor light emitting device of the third embodiment.

As shown in FIGS. 10A, 10B, an ultraviolet absorbing solution 48, which has the ultraviolet absorbing material 46 dissolved in a solvent, is provided in the cup shaped portion 26, such that the blue LED chip 2 is covered by the ultraviolet absorbing solution 48. The ultraviolet absorbing solution 48 may be potted onto the blue LED chip 2 by using dispenser. A heat treatment is provided with that state such that the solvent is vaporized.

As shown in FIG. 9, the ultraviolet absorbing layer 46, which is dissolved in the ultraviolet absorbing solution 48 as the ultraviolet absorbing material, is left on the blue LED chips 2. The ultraviolet absorbing layer 46 is provided on the upper surfaces and side surface of the blue LED chip 2. That is, light extraction surface of the blue LED chip 2 is covered with the ultraviolet absorbing layer 46.

The ultraviolet absorbing layer 46 is also provided on the lead 8*a* in the cup shaped portion 26, and on the inner surface of the cup shaped portion 26 near the blue LED chip 2, since the ultraviolet absorbing solution 48 is provided thereon before vaporization. An upper edge of the ultraviolet absorbing layer 46 may be provided below the blue LED chip 2 as shown in FIG. 9. The LED chips 2, 3 and the ultraviolet absorbing layer 46 are covered with the sealing resin 7.

In this third embodiment, the light extraction surface of the blue LED chip 2 is covered with the ultraviolet absorbing layer 46. A spectrum in ultraviolet band of light emitted from yellow LED chip 3 is small and less than a spectrum in ultraviolet band of light emitted from blue LED chip 2. So it may be available that the light extraction surface of the yellow LED chip 3 is not covered with the ultraviolet absorbing layer 46.

The amount of a visible light absorbed by the ultraviolet absorbing layer 46 may be reduced, since the yellow LED chip 3 is not covered with the ultraviolet absorbing layer 46. So light extraction efficiency of yellow light may be improved.

In this third embodiment, the semiconductor light emitting device 93 has the blue LED chip and the yellow LED chip. However the cyan LED chip and the red LED chip may be provided instead of the blue LED chip and the yellow LED chip in the semiconductor light emitting device 93. In such case, the cyan LED chip is covered with the ultraviolet absorbing layer and the red LED chip is not covered with the ultraviolet absorbing layer.

Embodiments of the invention have been described with reference to the examples. However, the invention is not limited thereto.

In the first, second and third embodiment, the ultraviolet absorbing layer is provided on a light extraction surface of the LED chip by adding a solution onto mounted LED chip. However, the ultraviolet absorbing layer may be provided on the light extraction surface of the LED chip by other way. For example, the LED chip may be dipped into an ultraviolet absorbing solution, which has the ultraviolet absorbing material dissolved in a solvent, and the solution later vaporized. An ultraviolet absorbing material may be sprayed on the LED chip. In this case, a mask may be provided on a part of the LED chip so as to being not covered with the ultraviolet absorbing material.

In the first, second and third embodiment, the ultraviolet absorbing layer is used in order to block at least part of the ultraviolet band of light. However a material, which is capable of blocking ultraviolet band and translucent to visible band, may be used as the ultraviolet absorbing layer. An inorganic material, such as TiO2, ZnO or the like, may be used as the ultraviolet absorbing layer.

In the first and second embodiment, the thickness of the ultraviolet absorbing layer is about 20 μm-about 1 mm. However the thickness may be not limited to this range, as long as the ultraviolet absorbing layer is capable of absorbing ultraviolet band. For example, in case Ethyl2-cyano3, 3-diphenylacrylate is used as the ultraviolet absorbing layer, the thickness about 20 μm or more may be necessary to obtain about 20% ultraviolet absorbing effect in about 380 nm wavelength. The thickness about 430 μm or more may be necessary to obtain about 25% ultraviolet absorbing effect in about 400 nm wavelength.

It may be preferable that the ultraviolet absorbing layer is substantially translucent to visible light.

The ultraviolet absorbing layer may be provided on a blue LED chip in a semiconductor light emitting device, which has the blue LED chip and phosphor and does not have other color LED chip. For example, a semiconductor light emitting device may include a first semiconductor light emitting element mounted on the first lead, being configured to emit a light having an optical emission spectrum no more than 400 nm from a light extraction surface of the first semiconductor light emitting element, and an ultraviolet absorbing layer configured to cover the light extraction surface of the first semiconductor light emitting element, and a sealing resin configured to cover the ultraviolet absorbing layer and first semiconductor light emitting element. The sealing resin may be lower in hardness than the ultraviolet absorbing layer.

The number of the LED chips provided in a single package is not limited to two LED chips. It may be available that three color LED chips, which are three primary color LED chips, such as a red LED chip, a green LED chip and a blue LED chip, are provided in a single package.

In these embodiments, the semiconductor light emitting device is explained in SMD type. However the semiconductor light emitting device may be lamp type.

For example, the material of the LED chip is not limited to InGaAlP-based or GaN-based semiconductors, but may include various other Group III-V compound semiconductors such as GaAlAs-based and InP-based semiconductors, or Group II-VI compound semiconductors, or various other semiconductors.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor light emitting device, comprising:
    a first lead;
    a second lead;
    a first semiconductor light emitting element mounted on the first lead, said first semiconductor light emitting element being configured to emit a light having an optical emission spectrum no more than 400 nm from a light extraction surface of the first semiconductor light emitting element;
    a second semiconductor light emitting element mounted on the second lead, being configured to emit a light having a peak wavelength of no less than 550 nm;
    an ultraviolet light absorbing layer configured to cover the light extraction surface of the first semiconductor light emitting element; and
    a sealing resin configured to cover the ultraviolet light absorbing layer, the first semiconductor light emitting element, and the second semiconductor light emitting element,
    wherein the ultraviolet light absorbing layer includes at least one of cyanoacrylate, benzotriazol, salicylate, and benzophenone.

2. A semiconductor light emitting device of claim 1, wherein the sealing resin is lower in hardness than the ultraviolet light absorbing layer.

3. A semiconductor light emitting device of claim 1, wherein a peak wavelength of light emitted from the first semiconductor light emitting element and the second light emitting element is in visible light band.

4. A semiconductor light emitting device of claim 1, wherein the ultraviolet light absorbing layer has no less than about 20 µm and no more than about 1 mm in thickness.

5. A semiconductor light emitting device of claim 1, wherein the ultraviolet light absorbing layer includes cyanoacrylate.

6. A semiconductor light emitting device of claim 1, wherein the ultraviolet light absorbing layer includes benzotriazol.

7. A semiconductor light emitting device of claim 1, wherein the ultraviolet light absorbing layer includes salicylate.

8. A semiconductor light emitting device of claim 1, wherein the ultraviolet light absorbing layer includes benzophenone.

9. A semiconductor light emitting device of claim 1, further comprising: a package having a cup shaped portion on a upper surface of the package, wherein the first semiconductor light emitting element, the second semiconductor light emitting element, a part of the first lead, and a part of the second lead are provided in a bottom surface of the cup shaped portion, and the ultraviolet light absorbing layer is provided on the first lead in the cup shaped portion.

10. A semiconductor light emitting device of claim 9, wherein the ultraviolet light absorbing layer is provided on the second lead in the cup shaped portion.

11. A semiconductor light emitting device of claim 9, wherein the ultraviolet light absorbing layer is provided on a surface of the cup shaped portion of the package.

12. A semiconductor light emitting device of claim 11, wherein an upper edge of the ultraviolet light absorbing layer provided on the surface of the cup shaped portion of the package is provided higher than an upper surface of the first semiconductor light emitting element.

13. A semiconductor light emitting device of claim 12, wherein the sealing resin is lower in hardness than the ultraviolet light absorbing layer.

14. A semiconductor light emitting device, comprising:
a first lead;
a second lead;
a first semiconductor light emitting element mounted on the first lead, being configured to emit a light having an optical emission spectrum no more than 400 nm from a light extraction surface of the first semiconductor light emitting element;
a second semiconductor light emitting element mounted on the second lead, being configured to emit a light having a peak wavelength in no less than 550 nm from a light extraction surface of the second semiconductor light emitting element;
an ultraviolet light absorbing layer configured to cover the light extraction surface of the first semiconductor light emitting element and the light extraction surface of the second semiconductor light emitting element; and
a sealing resin configured to cover the ultraviolet light absorbing layer, the first semiconductor light emitting element and the second semiconductor light emitting element,
wherein the ultraviolet light absorbing layer includes at least one of cyanoacrylate, benzotriazol, salicylate, and benzophenone.

15. A semiconductor light emitting device of claim 14, wherein the sealing resin is lower in hardness than the ultraviolet light absorbing layer.

16. A semiconductor light emitting device of claim 14, wherein a peak wavelength of light emitted from the first semiconductor light emitting element and the second light emitting element is in visible light band.

17. A semiconductor light emitting device of claim 14, wherein the ultraviolet light absorbing layer has no less than about 20 µM and no more than about 1 mm in thickness.

18. A semiconductor light emitting device of claim 14, wherein the ultraviolet light absorbing layer includes cyanoacrylate.

19. A semiconductor light emitting device of claim 14, wherein the ultraviolet light absorbing layer includes benzotriazol.

20. A semiconductor light emitting device of claim 14, wherein the ultraviolet light absorbing layer includes salicylate.

21. A semiconductor light emitting device of claim 14, wherein the ultraviolet light absorbing layer includes benzophenone.

22. A semiconductor light emitting device of claim 14, further comprising a package having a cup shaped portion on a upper surface of the package, wherein the first semiconductor light emitting element, the second semiconductor light emitting element, a part of the first lead and a part of the second lead are provided in a bottom surface of the cup shaped portion, and the ultraviolet light absorbing layer is provided on the first lead in the cup shaped portion.

23. A semiconductor light emitting device of claim 22, wherein the ultraviolet light absorbing layer is provided on the second lead in the cup shaped portion.

24. A semiconductor light emitting device of claim 23, wherein the ultraviolet light absorbing layer is provided on a surface of the cup shaped portion of the package.

25. A semiconductor light emitting device of claim 24, wherein an upper edge of the ultraviolet light absorbing layer provided on the surface of the cup shaped portion of the package is provided higher than an upper surface of the first semiconductor light emitting element.

26. A semiconductor light emitting device of claim 22, wherein the ultraviolet light absorbing layer is provided on a surface of the cup shaped portion of the package.

27. A semiconductor light emitting device of claim 26, wherein an upper edge of the ultraviolet light absorbing layer provided on the surface of the cup shaped portion of the package is provided higher than an upper surface of the first semiconductor light emitting element.

28. A semiconductor light emitting device of claim 27, wherein the sealing resin is lower in hardness than the ultraviolet light absorbing layer.

* * * * *